US009680097B2

(12) United States Patent
Mandal et al.

(10) Patent No.: US 9,680,097 B2
(45) Date of Patent: Jun. 13, 2017

(54) ORGANIC THIN FILM TRANSISTORS AND METHODS FOR THEIR MANUFACTURING AND USE

(71) Applicant: INDIAN INSTITUTE OF TECHNOLOGY KANPUR, Kanpur (IN)

(72) Inventors: Saumen Mandal, Naskarpur (IN); Monica Katiyar, Kanpur (IN)

(73) Assignee: INDIAN INSTITUTE OF TECHNOLOGY KANPUR (IN)

( * ) Notice: Subject to any disclaimer, the term of this patent is extended or adjusted under 35 U.S.C. 154(b) by 0 days.

(21) Appl. No.: 14/782,600

(22) PCT Filed: Apr. 3, 2014

(86) PCT No.: PCT/IB2014/060398
§ 371 (c)(1),
(2) Date: Oct. 5, 2015

(87) PCT Pub. No.: WO2014/162287
PCT Pub. Date: Oct. 9, 2014

(65) Prior Publication Data
US 2016/0043315 A1    Feb. 11, 2016

(30) Foreign Application Priority Data
Apr. 6, 2013 (IN) .......................... 1032/DEL/2013

(51) Int. Cl.
*H01L 51/00* (2006.01)
*H01L 51/05* (2006.01)
*H01L 27/32* (2006.01)

(52) U.S. Cl.
CPC ...... *H01L 51/0005* (2013.01); *H01L 51/0022* (2013.01); *H01L 51/0096* (2013.01);
(Continued)

(58) Field of Classification Search
CPC ............ H01L 51/0005; H01L 51/0022; H01L 51/0096; H01L 51/0097; H01L 51/052;
(Continued)

(56) References Cited

U.S. PATENT DOCUMENTS 7,098,061 B2    8/2006 Sirringhaus et al.
7,351,606 B2    4/2008 Arias
(Continued)

FOREIGN PATENT DOCUMENTS

CN    1545453 A    11/2004
CN    101356651 A    1/2009

OTHER PUBLICATIONS

"Printed and Flexible Electronics Services: Development and optimization of materials and devices," PARC, accessed at URL<http://web.archive.org/web/20120427022641/http://www.parc.com/publication/2355/printed-and-flexible-electronics-services.html> on Oct. 7, 2015, pp. 2.
(Continued)

*Primary Examiner* — Karen Kusumakar
(74) *Attorney, Agent, or Firm* — Ren-Sheng International

(57) ABSTRACT

Methods of forming an organic thin film transistor are provided. The methods include providing a substrate and depositing and patterning a gate electrode on a first surface of the substrate. The methods include dispensing a first droplet of an insulating material on the gate electrode on the substrate and dispensing a second droplet of a semiconductor material on a first surface of the first droplet. The second droplet forms a hydrophobic structure having a central cavity. The methods also include dispensing a third droplet of a conductor material on a first surface of the second droplet such that the conductor material substantially fills the central cavity of the hydrophobic structure and forms a conductor material layer around the central cavity to define a source electrode and a drain electrode of the organic thin film transistor.

25 Claims, 5 Drawing Sheets

(52) U.S. Cl.
CPC ........ *H01L 51/0097* (2013.01); *H01L 51/052* (2013.01); *H01L 51/055* (2013.01); *H01L 51/0545* (2013.01); *H01L 51/0558* (2013.01); *H01L 27/3274* (2013.01); *H01L 51/004* (2013.01); *H01L 51/0037* (2013.01); *H01L 51/0055* (2013.01); *H01L 51/0094* (2013.01)

(58) Field of Classification Search
CPC  H01L 51/0545; H01L 51/055; H01L 51/0558
See application file for complete search history.

(56) References Cited

U.S. PATENT DOCUMENTS

| | | | |
|---|---|---|---|
| 7,364,996 | B2 | 4/2008 | Kawase |
| 7,431,860 | B2 | 10/2008 | Kawase |
| 8,173,997 | B2 | 5/2012 | Tano et al. |
| 2005/0151820 | A1 | 7/2005 | Sirringhaus et al. |
| 2006/0159838 | A1* | 7/2006 | Kowalski ............... B82Y 30/00 427/58 |
| 2007/0178616 | A1* | 8/2007 | Arai ....................... B82Y 30/00 438/29 |
| 2010/0155710 | A1 | 6/2010 | Lee et al. |
| 2011/0248248 | A1 | 10/2011 | Ukeda |
| 2012/0104366 | A1* | 5/2012 | Cho ................... H01L 51/0005 257/40 |

OTHER PUBLICATIONS

Jung-Pyo Hong et al., "Solution-Based Direct Growth of Organic Crystals on an Active Channel Region for Printable Bottom-Contact Organic Field-Effect Transistors", Angewandte Chemie International Edition, 2009, pp. 3096-3098, vol. 48.

International Search Report and Written Opinion of the International Searching Authority, International application No. PCT/IB2014/060398, Oct. 2, 2014.

Masayuki Kaneda et al., "Film Formation From Polymer Solution Using Inkjet Printing Method", AIChE Journal, May 2007, pp. 1100-1108, vol. 53, No. 5.

Jung Ah Lim et al., "Control of the Morphology and Structural Development of Solution-Processed Functionalized Acenes for High-Performance Organic Transistors", Advanced Functional Materials, 2009, pp. 1515-1525, vol. 19.

Steven Molesa et al., "High-Quality Inkjet-Printed Multilevel Interconnects and Inductive Components on Plastic for Ultra-Low-Cost RFID Applications", Materials Research Society Symp. Proceedings, 2003, pp. H8.3.1-H8.3.6., vol. 769.

Matthias Plötner et al., "Investigation of Ink-Jet Printing of Poly-3-Octylthirophene for Organic Field-Effect Transistors from Different Solutions", Synthetic Metals, 2004, pp. 299-303, vol. 147.

Christoph W. Sele et al., "Lithography-Free, Self-Aligned Inkjet Printing with Sub-Hundred-Nanometer Resolution", Advanced Materials, Apr. 18, 2005, pp. 997-1001, vol. 17, No. 8.

H. Sirringhaus et al., "High-Resolution Inkjet Printing of All-Polymer Transistor Circuits", Science, Dec. 15, 2000, pp. 2123-2126, vol. 290.

Dan Soltman et al., "Inkjet-Printed Line Morphologies and Temperature Control of the Coffee Ring Effect", Langmuir, 2008, pp. 2224-2231, vol. 24.

Ando, M., et al., "Self-Aligned Self-Assembly Process for Fabricating Organic Thin-film Transistors", Applied Physics Letters, Sep. 6, 2004, vol. 85, No. 10, pp. 1849-1851.

Takeo Kawase et al., "Inkjet Printing of Polymeric Field-Effect Transistors and Its Applications", Japanese Journal 01 Applied Physics, May 2005, vol. 44, No. 6A, pp. 3649-3658.

* cited by examiner

ORGANIC THIN FILM TRANSISTORS AND METHODS FOR THEIR MANUFACTURING AND USE

CROSS-REFERENCE TO RELATED APPLICATIONS

This application is U.S. national stage filing under 35 U.S.C. 371 of International Application PCT/IB2014/060398, filed on Apr. 3, 2014. The international Application claims priority from Indian Patent Application Serial No. 1032/DEL/2013, filed on Apr. 6, 2013. The Indian Patent Application and the International Application are incorporated by reference herein in their entirety.

BACKGROUND

Organic thin film transistors (OTFTs) are used in flexible displays such as liquid crystal display devices, organic electroluminescent devices and inorganic electroluminescent devices. Typically, the OTFTs in such devices are used as switching devices that control the operation of each pixel and as driving devices that drive the pixels. Moreover, OTFTs are also used in radio frequency identification (RFID) circuitry, smart cards and sensing devices.

An OTFT typically includes a semiconductor layer having source and drain regions and a channel region, a gate electrode insulated from the semiconductor layer and located in a region corresponding to the channel region. The OTFT also includes source and drain electrodes respectively contacting the source and drain regions.

Currently, OTFTs are fabricated using techniques such as lithography, spin coating and evaporation. Other techniques for forming the OTFTs include printing techniques such as inkjet printing, flexographic printing, gravure printing, offset printing and screen printing. However, it is difficult to control a channel length of the OTFTs formed using such printing techniques. Moreover, certain techniques require additional steps of substrate patterning to control the channel length thereby leading to substantial manufacturing costs.

SUMMARY

The foregoing summary is illustrative only and is not intended to be in any way limiting. In addition to the illustrative aspects, embodiments, and features described above, further aspects, embodiments, and features will become apparent by reference to the drawings and the following detailed description.

Briefly, in accordance with one aspect, methods of forming an organic thin film transistor are provided. The methods include providing a substrate and depositing and patterning a gate electrode on a first surface of the substrate. The methods include dispensing a first droplet of an insulating material on the gate electrode of the substrate and dispensing a second droplet of a semiconductor material on a first surface of the first droplet. The second droplet forms a hydrophobic structure having a central cavity. The methods also include dispensing a third droplet of a conductor material on a first surface of the second droplet such that the conductor material substantially fills the central cavity of the hydrophobic structure and forms a conductor material layer around the central cavity to define a source electrode and a drain electrode of the organic thin film transistor.

In accordance with another aspect, methods of forming three-dimensional features on a substrate are provided. The methods include sequentially dispensing a plurality of droplets of one or more deposition materials on a first surface of the substrate to form a three dimensional feature on the substrate. The plurality of the droplets are dispensed on substantially same location of the substrate to form overlapping droplets on the substrate. The methods also include adjusting hydrophobic properties of respective surfaces of the plurality of overlapping droplets to facilitate self-assembling of the droplets on the substrates and to control a profile of the three dimensional feature.

In accordance with another aspect, organic thin film transistors are provided. The organic thin film transistors can include a substrate with a patterned gate electrode formed on a first surface of the substrate and an insulating layer disposed on the gate electrode. The organic thin film transistors can also include a semiconductor layer having a well-shaped structure with a central cavity disposed on the first surface of the insulating layer. The first surface of the well-shaped structure is a hydrophobic surface. The organic thin film transistors can also include a water-soluble conductor material disposed around the semiconductor layer and within the central cavity of the semiconductor layer to form a source electrode and a drain electrode of the organic thin film transistor.

DETAILED DESCRIPTION

Figure 1:
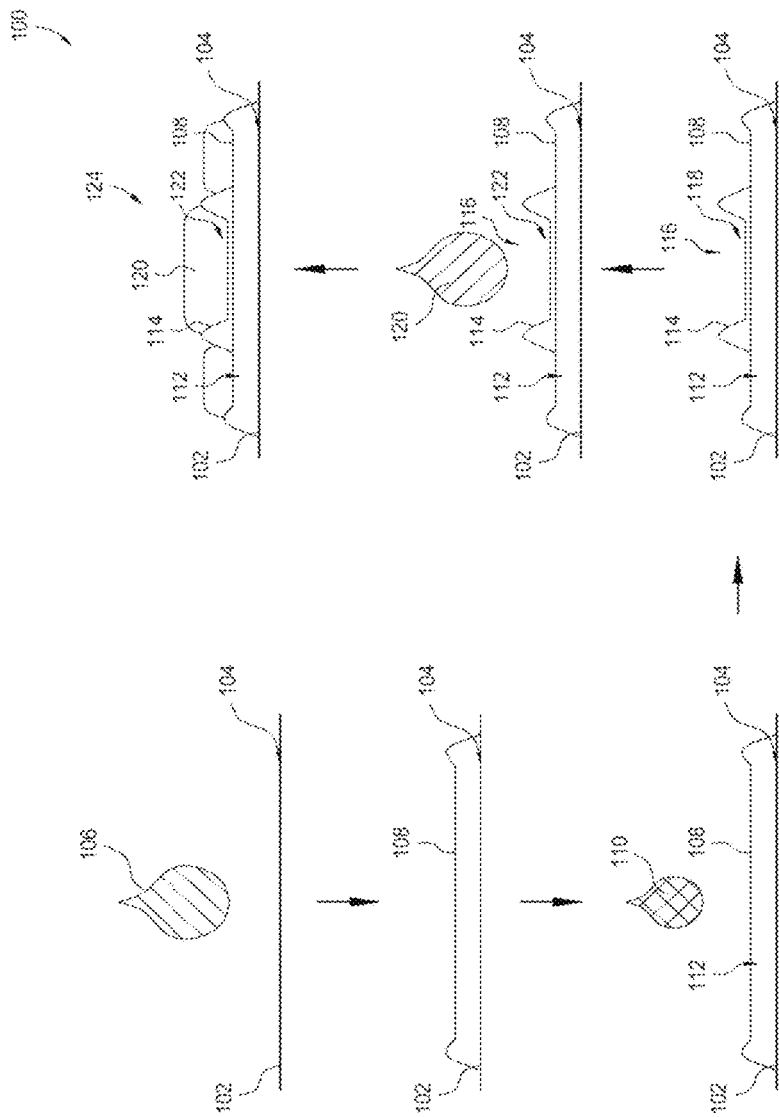
FIG. 1 is an example diagram illustrating an embodiment of a method of forming an organic thin film transistor.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be used, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

It will also be understood that any compound, material or substance which is expressly or implicitly disclosed in the specification and/or recited in a claim as belonging to a group or structurally, compositionally and/or functionally related compounds, materials or substances, includes individual representatives of the group and all combinations thereof. While various compositions, methods, and devices are described in terms of "comprising" various components or steps (interpreted as meaning "including, but not limited to"), the compositions, methods, and devices can also "consist essentially of" or "consist of" the various components and steps, and such terminology should be interpreted as defining essentially closed-member groups.

Example embodiments are generally directed to techniques of forming organic thin film transistors (OTFTs). The embodiments described below provide a self-aligning fabrication technique for forming OTFTs using single drops of materials such as insulating, semiconductor and conductor materials. The arrays of OTFTs formed using this technique may be used for a variety of applications such as for electroluminescent display devices, sensing devices and so forth. For example, the OTFTs may be used in sensing devices used in sustainable food packaging and other similar industries.

The technique may also be used for forming three-dimensional features on substrates by sequentially dispensing droplets of one or more deposition materials on a substrate and adjusting hydrophobic properties of the droplets to facilitate self-assembling of the droplets to achieve a desired profile of the three-dimensional feature.

Referring now to FIG. 1 an example diagram 100 illustrating an embodiment of a method of forming an organic thin film transistor is provided. In the illustrated embodiment, a substrate 102 is provided. The substrate 102 can be a rigid substrate or a flexible substrate. Examples of the materials used for the substrate 102 include, but are not limited to, glass, silicon, polyethylene terephthalate (PET), polyethylene naphthalate (PEN), polytetrafluoroethylene (PTFE), polyimide (PI) or combinations thereof. In this example embodiment, the substrate 102 is a patterned substrate with a gate electrode formed on a first surface 104 of the substrate 102. The substrate 102 can generally be of any desired thickness. In one example embodiment, the thickness of the substrate 102 is about 60 microns to about 1,000 microns. Specific examples of thicknesses include about 60 microns, about 100 microns, about 200 microns, about 300 microns, about 400 microns, about 500 microns, about 600 microns, about 700 microns, about 800 microns, about 900 microns, about 1,000 microns, and ranges between any two of these values (including endpoints).

The gate electrode may be deposited and patterned on the first surface 104 of the substrate 102 using known patterning techniques. In this example embodiment, the gate electrode is formed of indium tin oxide (ITO). Examples of other materials for gate electrode include, but are not limited to, doped silicon, indium zinc oxide, gold (Au), silver (Ag), molybdenum (Mo), titanium (Ti), aluminum (Al), poly (3,4-ethylenedioxythiophene): poly(styrenesulfonate) (PEDOT:PSS), polyaniline, or combinations thereof.

In the illustrated embodiment, a first droplet 106 of an insulating material is dispensed on the first surface 104 of the substrate 102 to form an insulating layer 108 on the substrate 102. The first droplet 106 may be dispensed on the substrate 102 using a suitable dispensing device. For example, a micropipette, or a materials printer such as Dimatix printer from Fujifilm, U.S.A. may be used to dispense the first droplet 106 on the substrate 102. The first droplet 106 can generally have any drop volume such as about 10 picolitres to about 10 microlitres. Specific examples of drop volumes include about 10 picoliters, about 100 picoliters, about 1 nanoliter, about 10 nanoliters, about 100 nanoliters, about 1 microliter, about 10 microliters, and ranges between any two of these values (including endpoints).

In the example embodiment, the first droplet 106 of the insulating material includes poly(4-vinyl phenol) (PVPh). Examples of other insulating materials include polyvinyl alcohol (PVA), poly(methyl methacrylate) (PMMA), polyvinylidene difluoride (PVDF), poly[(vinylidenefluoride-co-trifluoroethylene] [P(VDF-TrFE)], P(VDF-TFE), polyvinyl chloride (PVC), MDX6 nylon, polystyrene (PS), polyvinyl pyrrolidone (PVP), cyanoethylpullam (CYPEL), poly($\alpha$-methylstyrene) (P$\alpha$MS), poly(ethyl methacrylate) (PEMA), poly(butyl methacrylate) (PBMA), polyethylene (PE), poly-(acrylonitrile) (PAN), polyaniline (PANI), or combinations thereof.

The first droplet 106 of the insulating material can be heated to achieve a dry surface of the insulating layer 108. The heating can generally be at an elevated temperature, such as a temperature of about 100° C. to about 250° C. Specific examples of elevated temperatures include about 100° C., about 125° C., about 150° C., about 175° C., about 200° C., about 225° C., about 250° C., and ranges between any two of these values (including endpoints). In one example embodiment, the first droplet 106 of the insulating material is heated to a temperature of about 160° C.

Moreover, a second droplet 110 of a semiconductor material can be dispensed on a first surface 112 of the insulating layer 108 to form a semiconductor layer 114. Again, the second droplet 110 may be dispensed using a suitable dispensing device. In this example embodiment, the second droplet 110 forms a hydrophobic structure 116 having a central cavity 118.

The semiconductor layer 114 may be formed of p-type semiconductor materials such as 6,13-bis(triisopropylsilylethynyl)pentacene (TIPS-pentacene), 6,13-bis(trimethylsilyl)pentacene, 6,13-Bis((triethylsilyl)ethynyl)pentacene, 6,13-bis(t-butyl ethynyl)pentacene, 6,13-bis(Hexyl ethynyl) pentacene, 6,13-triethylsilylethynyl anthradithiophene, poly (3-octylthiophene-2,5-diyl) (P3OT), or combinations thereof. Alternately, the semiconductor layer 114 may be formed of n-type semiconductor materials such as N,N-bis (n-octyl)-1,6-dicyanoperylene-3,4:9,10-bis(dicarboximide) (PDI-8CN2), poly{[N,N'-bis(2-octyldodecyl)-naphthalene 1,4,5,8 bis(dicarboximide)-2,6-diyl]alt-5,5'-(2,2'-bithiophene)}[P(NDI2OD-T2)], or combinations thereof.

In this example embodiment, the semiconductor layer 114 is formed of TIPS-pentacene. Moreover, a diameter of the second droplet 110 is relatively lesser than a diameter of the first droplet 106. In certain embodiments, the diameter of the first droplet 106 is about 5 mm to about 12 mm Specific examples of the first diameter include about 5 mm, about 6 mm, about 7 mm, about 8 mm, about 9 mm, about 10 mm, about 11 mm, about 12 mm, and ranges between any two of these values (including endpoints). Further, the diameter of the second droplet 110 is about 3 mm to about 6 mm Specific examples of the second diameter include about 3 mm, about 4 mm, about 5 mm, about 6 mm, and ranges between any two of these values (including endpoints). In certain example embodiments, the diameter of the second droplet 110 is about 0.3 times to about 0.6 times the diameter of the first droplet 106. In one example, the diameter of the second droplet 110 is around 0.5 times the diameter of the first droplet 106.

The semiconductor material used to form the second droplet 110 can be dissolved in at least one solvent prior to dispensing the second droplet 110 on the substrate 102. Subsequently, the second droplet 110 of the semiconductor material can be dried by natural evaporation. Examples of the solvent include, but not limited to, chlorobenzene, 1,2 dichlorobenzene, or combinations thereof. After drying, the second droplet 110 forms the well-shaped hydrophobic structure 116.

In certain example embodiments a hydrophobic agent is added to the second droplet 110 to enhance the hydrophobicity of the surface of the second droplet 110. Examples of the hydrophobic agent include, but are not limited to, oxygen ($O_2$), plasma, carbon tetrafluoride ($CF_4$) plasma, cationic di-n-decyl dimethyl ammonium chloride, benzalkonium chloride, or combinations thereof.

Moreover, a third droplet 120 of a conductor material can be dispensed on a first surface 122 of the semiconductor layer 114. In this example embodiment, the conductor material includes a water-soluble conductor material. The third droplet 120 can generally have any drop volume such as about 1 microlitre to about 2 microlitres. Again, the third droplet 120 may be dispensed on the semiconductor layer 114 using a suitable dispensing device. In certain embodiments, an outer diameter of the third droplet 120 is about 5 mm to about 8 mm Specific examples of the outer diameter include about 5 mm, about 6 mm, about 7 mm, about 8 mm, and ranges between any two of these values (including endpoints).

Here, the water-soluble conductor material is disposed around the semiconductor layer 114 and within the central cavity 118 of the well-shaped hydrophobic structure 116. In the illustrated embodiment, the conductor material includes poly (3,4 ethylenedioxythiophene)poly(styrenesulfonate)) (PEDOT:PSS). Examples of other conductor materials include, but are not limited to, water soluble doped polyaniline, nano silver dissolved in water, nano gold dissolved in water, or combinations thereof.

As can be seen, a portion of the third droplet 120 of the conductor material can be trapped inside the central cavity 118 of the hydrophobic structure 116 and the remaining conductor material is disposed around the central cavity 118 to form a ring-shaped configuration that forms a source electrode and a drain electrode of the organic thin film transistor generally represented by reference numeral 124. It should be noted that the hydrophobic surface of the semiconductor layer 114 facilitates the self-alignment of the conductor material to form the source electrode and the drain electrode on the substrate 102. In certain embodiments, a height and a width of the ring-shaped configuration may be controlled by changing a concentration of the conductor material.

In the illustrated embodiment, a thickness of the well-shaped hydrophobic structure 116 can define a channel length of the organic thin film transistor 124. In certain embodiments, the channel length of the organic thin film transistor 124 is less than about 10 micrometers ($\mu m$). In one example embodiment, the channel length of the organic thin film transistor 124 is about 4 $\mu m$.

The example technique described above with reference to FIG. 1 may be used for forming a variety of three-dimensional features on a substrate such as required in 3D printing processes. As described above, a plurality of droplets of one or more deposition materials may be sequentially dispensed on a substrate to form a three-dimensional feature on the substrate. The plurality of droplets can be dispensed on substantially same location of the substrate to form overlapping droplets on the substrate and hydrophobic properties of respective surfaces of the plurality of overlapping droplets may be adjusted to facilitate self-assembling of the droplets on the substrate and to control a profile of the three-dimensional feature. Moreover, a drop volume of each of the plurality of droplets may be controlled to control the profile of the three-dimensional feature.

EXAMPLES

The present invention will be described below in further detail with examples and comparative examples thereof, but it is noted that the present invention is by no means intended to be limited to these examples.

Example 1

Formation of an OTFT

An OTFT was formed using the example method of FIG. 1. A PET substrate having a thickness of about 175 microns was patterned with an ITO gate electrode. A first droplet of PVPh having a diameter of about 6 mm and a drop volume of about 2 microlitres was dispensed on the substrate. The first droplet was dispensed using a commercially available micropipette. The first droplet of the PVPh was then heated at a temperature of about 160° C. Next, a second droplet of TIPS pentacene was dispensed on a top surface of the PVPh droplet. The drop volume of the TIPS pentacene droplet was about 1 microlitre GAL) and the diameter of the droplet was about 3 mm.

Here, TIPS pentacene was first dissolved in chlorobenzene and after drop casting it was dried by natural evaporation process to form a well-shaped structure with a central cavity. A third droplet of PEDOT:PSS was dispensed on the TIPS pentacene droplet. The drop volume of the PEDOT:PSS droplet was about 1.5 microlitres GAL) and the diameter of the droplet was about 5.5 mm Here, a portion of the PEDOT:PSS was trapped inside the central cavity of the well-shaped structure and the rest surrounded the cavity to form a ring structure that formed the source electrode and the drain electrode of the OTFT.

Example 2

Experimental Results for a Cavity Structure of an OTFT

Figure 2:
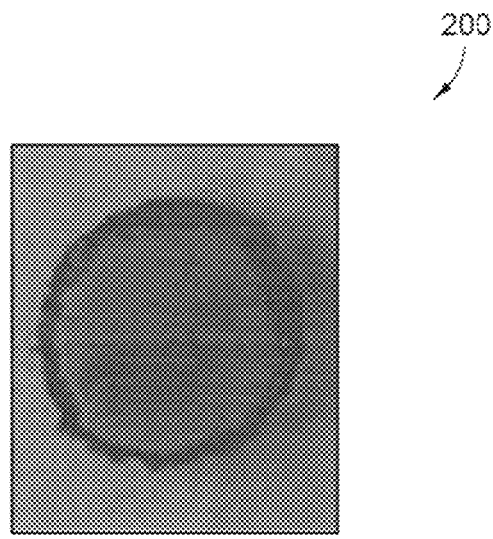
FIG. 2 is an example image of a single droplet of TIPS-pentacene casted on a surface of a poly(4-vinylphenol) (PVPh) coated substrate.

FIG. 2 is an example image 200 of a single droplet of TIPS-pentacene casted on a PVPh coated surface of an ITO-PET substrate. The TIPS-pentacene droplet having a drop volume of about 9 $\mu l$ dissolved in about 1 wt % of chlorobenzene was casted on the PVPh coated surface. As can be seen from the image 200, a well-shaped ring of TIPS-pentacene was observed. The diameter of ring was measured to be about 6 mm.

Example 3

Characterization of an OTFT

Figure 3:
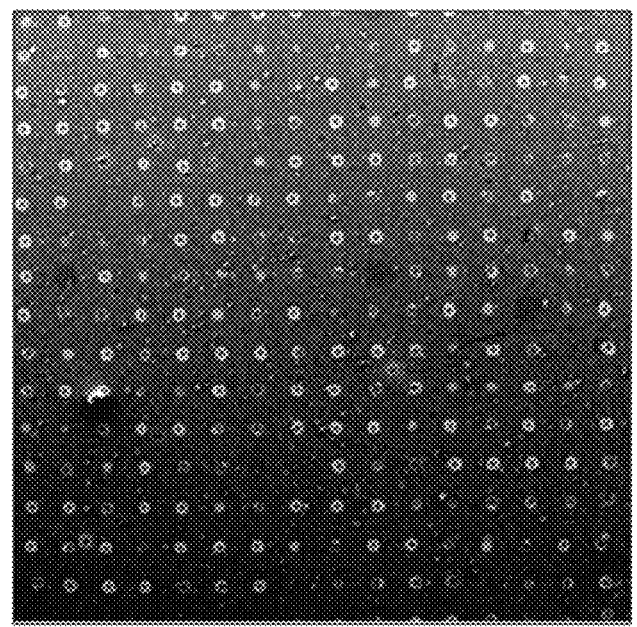
FIG. 3 is an example scanning electron microscopy (SEM) image of an array of droplets of 6,13-Bis(triisopropylsilylethynyl)pentacene (TIPS-pentacene) dispensed on droplets a PVPh coated substrate.

An OTFT was formed using the example method of FIG. 1 and was characterized using scanning electron microscopy. FIG. 3 is an example scanning electron microscope (SEM) image 300 of an array of droplets of TIPS-pentacene dispensed on a PVPh coated substrate. Here, TIPS-pentacene was first dissolved in chlorobenzene and subsequently an array of TIPS-pentacene drops were printed on a PVPh coated substrate using a Dimatix Printer 2831 from Fujifilm, U.S.A. having a print head DMC-11610. The drop volume of the TIPS-pentacene drops was about 10 picoliters (pL).

As can be seen, each of the TIPS-pentacene drops forms a well-shaped ring on the PVPh coated substrate.

Figure 4:
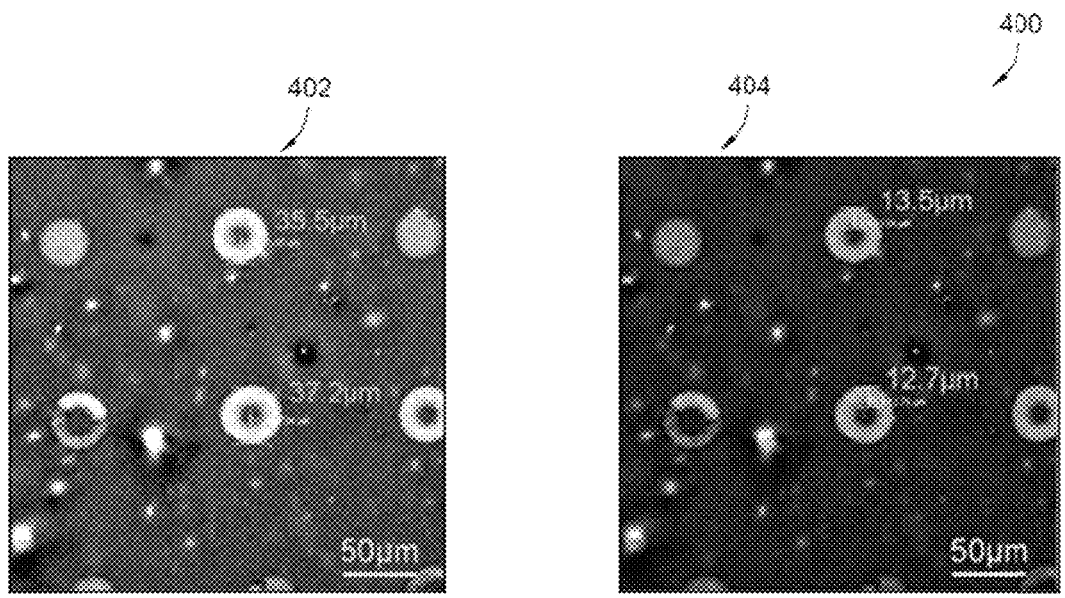
FIG. 4 illustrates example scanning electron microscopy (SEM) images of the TIPS-pentacene droplets of FIG. 3.
Figure 5:
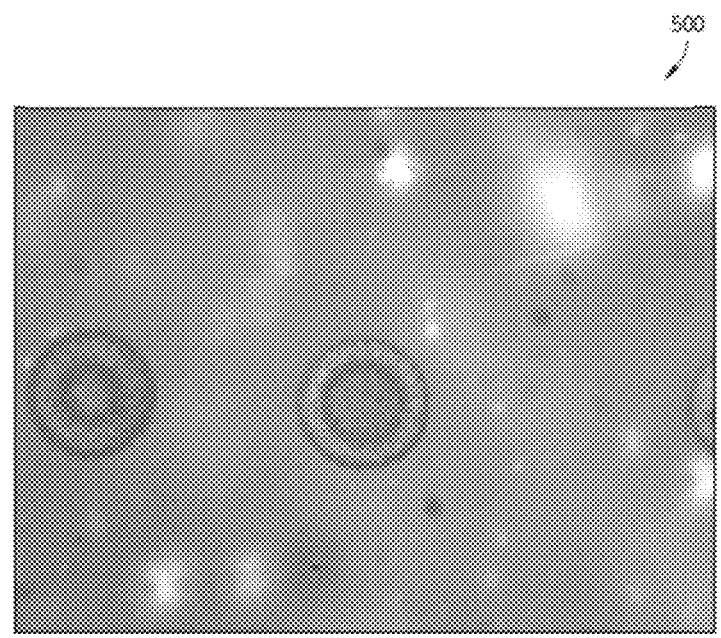
FIG. 5 is an example optical micrograph of a single drop of TIPS-pentacene dissolved in chlorobenzene dispensed on a PVPh coated substrate.

FIG. 4 illustrates example scanning electron microscopy (SEM) images 400 of the TIPS-pentacene droplets shown above on FIG. 3. Here, images 402 and 404 were used to estimate a diameter and a ring width of each TIPS-pentacene droplet. The ring width of the TIPS-pentacene droplets that defined the channel length of the OTFT was estimated to be in the range of about 10 microns to about 13 microns. Further, an average diameter of the printed TIPS-pentacene droplets was estimated to be in the range of about 35 microns to about 45 microns. FIG. 5 is an example optical micrograph 500 of a single drop of TIPS-pentacene dissolved in chlorobenzene and drop casted on the PVPh surface. As can be seen from the optical micrograph 500, the formation of a ring shaped configuration of TIPS-pentacene was clearly observed.

Figure 6:
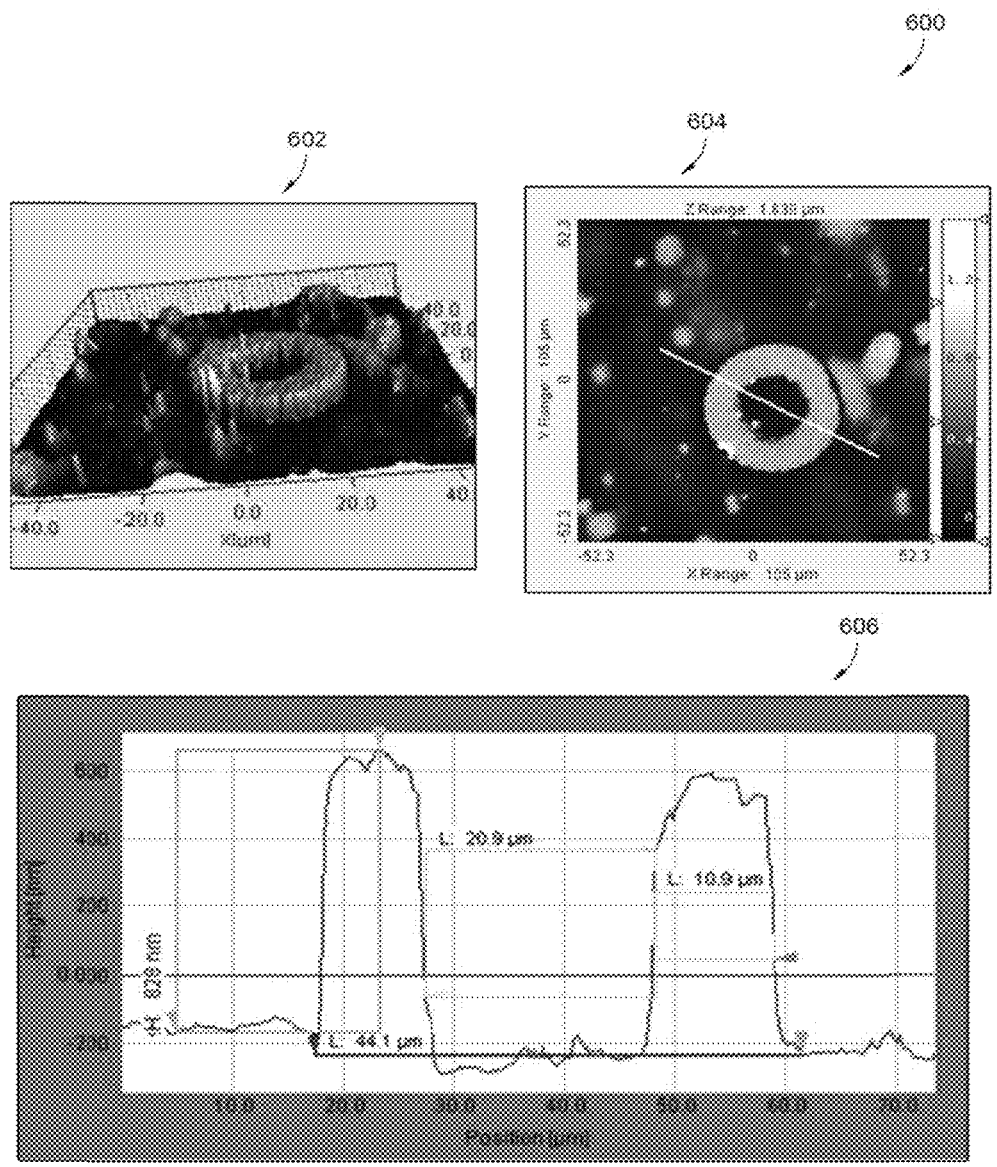
FIG. 6 illustrates example optical profilometry results obtained for a TIPS-pentacene droplet dispensed on a PVPh coated substrate.

FIG. 6 illustrates example optical profilometry results 600 obtained for a TIPS-pentacene droplet dispensed on a PVPh coated substrate. Here, three-dimensional and two-dimensional optical profilometry images of the TIPS-pentacene droplet are represented by reference numerals 602 and 604 respectively. Further, a line scan profilometry of the TIPS-pentacene droplet is represented by reference numeral 606. The images and the line scan profilometry were obtained using a NanoMap-D optical profilometer from AEP Technology, U.S.A. The images 602, 604 and the line scan profilometry 606 were used to measure the drop diameter, width of the ring formed on the substrate, height of the ring and an inside ring diameter. It should be noted that the width of the ring was a measure of the channel length of the OTFT. Here, the drop diameter was measured to be about 44.1 µm. The width and the height of the TIPS-pentacene ring were measured to be about 10.9 µm and about 0.828 µm respectively. Moreover, the inside diameter of the TIPS-pentacene ring was measured to be about 20.9 µm.

Figure 7:
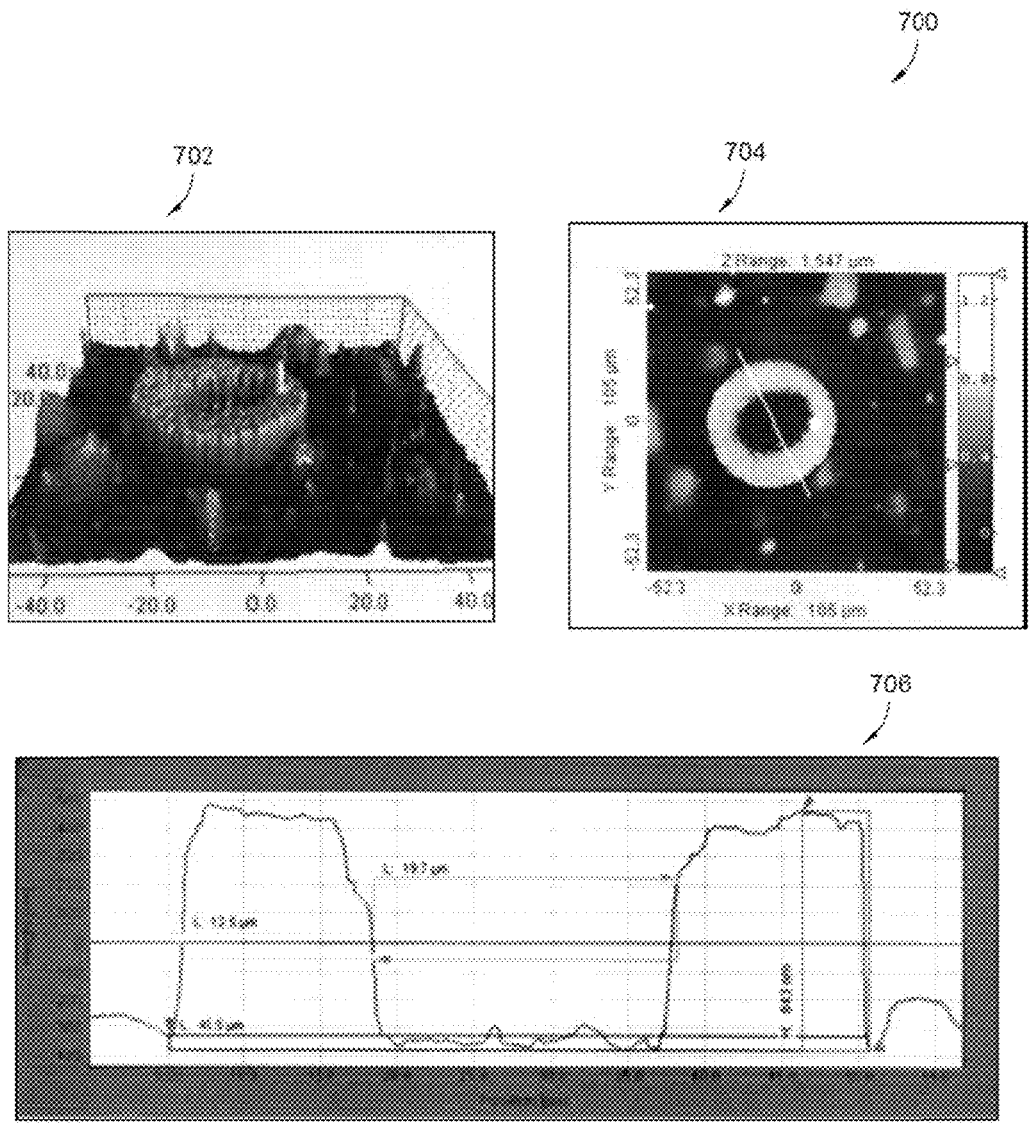
FIG. 7 illustrates example optical profilometry results obtained for another TIPS-pentacene droplet dispensed on a PVPh coated substrate.

FIG. 7 illustrates example optical profilometry results 700 obtained for another TIPS pentacene droplet dispensed on a PVPh coated substrate. Here, three-dimensional and two-dimensional optical profilometry images of the TIPS-pentacene droplet are represented by reference numerals 702 and 704 respectively. Further, a line scan profilometry of the TIPS-pentacene droplet is represented by reference numeral 706. The images 702, 704 and the line scan profilometry 706 were used to measure the drop diameter, width of the ring, height of the ring and an inside ring diameter. Here, the drop diameter was measured to be about 45.5 µm. The width and the height of the TIPS-pentacene ring were measured to be about 12.5 µm and about 0.843 µm respectively. Moreover, the inside diameter of the TIPS-pentacene ring was measured to be about 19.7 µm.

Example 4

Configuration of a Display with the OTFT Described Above

An OTFT was designed using the process described above. The OTFT had a channel length of about 4.2 µm and a channel width of about 175 µm. The OTFT was proposed for use in a display having a diagonal length of about 3.2 inches (about 8.1 cm). The pixel area was assumed to be about 250 µm×250 µm and a diameter of the OTFT was about 100 µm. Here, the resolution of the display was about 100 pixel per inch (ppi).

Example 5

Comparative Results of a Display with the OTFT Described Above Relative to Other Commercially Available Displays with OTFTs/OLEDs Table 1 shows the required channel length, channel width of an OTFT in a display of Example 4 and other commercially available OTFT based displays.

TABLE 1

| S. No | Substrate | Dielectric, Semiconductor & Conductor | Channel length (µm) Width (µm) | Mobility Threshold | Display size, No. of pixel, pixel size | Resolution |
|---|---|---|---|---|---|---|
| 1 | PEN | PVPh, pentacene | 30, 150 | 0.21-3.7 | 2.5" diagonal, 128 × 96 | AMOLED |
| 2 | Plastic | PI, nano Ag | 5, 57 | 0.1 | 3.2" diagonal, 540 × 360, 127 µm × 127 µm | 200 ppi AMOLED |
| 3 | PEN | Pentacene, Al & Au | 5, 190 | 0.05, 8, $10^5$ | 5.8" diagonal, 213 × 120, pixel pitch- 0.6 mm | AMOLED |
| 4 | Flexible glass | PVPh, pentacene, Al | 10, 100 | 0.4 | 4.7" diagonal, 640 × 480, 150 µm × 150 µm | AMOLED |
| 5 | PEN | PVPh, pentacene, Al | W/L > 40 | 0.21, 3.66 ± 2.72 × $10^7$ | 6" diagonal, 540 × 360, 380 µm × 380 µm | AMOLED |
| 6 Display of Example 4 | Plastic | PVPh, soluble pentacene, PEDOT:PSS | 4.2, 175 | — | 3.2" diagonal, 270 × 180, 250 µm × 250 µm | 100 ppi AMOLED |

As can be seen, a display device can be fabricated using an OTFT formed using the present technique. Further, the resolution of such display device is about 100 ppi. Moreover, the OTFT formed using the current technique does not require multiple steps of thin film deposition, lithography and patterning as required in the other devices thereby reducing the manufacturing costs.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation, no such intent is present.

For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.).

It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible sub ranges and combinations of sub ranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc.

As will also be understood by one skilled in the art all language such as "up to," "at least," "greater than," "less than," and the like include the number recited and refer to ranges which can be subsequently broken down into sub ranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. A method of forming an organic thin film transistor, the method comprising:
   providing a substrate;
   depositing and patterning a gate electrode on a first surface of the substrate;
   dispensing a first droplet of an insulating material on the first surface of the substrate;
   dispensing a second droplet of a semiconductor material on a first surface of the first droplet, wherein the second droplet forms a hydrophobic structure having a central cavity; and
   dispensing a third droplet of a conductor material on a first surface of the second droplet, wherein the conductor material substantially fills the central cavity of the hydrophobic structure and forms a conductor material layer around the central cavity to define a source electrode and a drain electrode of the organic thin film transistor.

2. The method of claim 1, wherein the substrate comprises a rigid substrate, or a flexible substrate.

3. The method of claim 2, wherein the substrate comprises glass, silicon, polyethylene terephthalate (PET), polyethylene naphthalate (PEN), or combinations thereof.

4. The method of claim 1, wherein the gate electrode comprises indium tin oxide (ITO), doped silicon, indium zinc oxide, gold (Au), silver (Ag), molybdenum (Mo), titanium (Ti), aluminum (Al), poly (3,4-ethylenedioxythiophene): poly (styrenesulfonate) (PEDOT:PSS), polyaniline, or combinations thereof.

5. The method of claim 1, wherein the insulating material comprises poly(4-vinylphenol) (PVPh), polyvinyl alcohol (PVA), poly (methyl methacrylate) (PMMA), polyvinylidene difluoride (PVDF), poly[(vinylidenefluoride-co-trifluoroethylene] [P(VDF-TrFE)], P(VDF-TFE), polyvinyl chloride (PVC), MDX6 nylon, polystyrene (PS), polyvinyl pyrrolidone (PVP), cyanoethylpullam (CYPEL), poly($\alpha$-methylstyrene) (P$\alpha$MS), poly(ethyl methacrylate) (PEMA), poly(butyl methacrylate) (PBMA), polyethylene (PE),poly-(acrylonitrile) (PAN), polyaniline (PANI), or combinations thereof.

6. The method of claim 1, further comprising heating the first droplet of the insulating material prior to dispensing the second droplet of the semiconductor material.

7. The method of claim 6, wherein the first droplet of the insulating material is heated at a temperature of about 100° C. to about 250° C.

8. The method of claim 1, wherein the semiconductor material comprises 6,13-Bis (triisopropylsilylethynyl) pentacene (TIPS pentacene), 6,13-bis(trimethylsilyl) pentacene, 6,13-Bis((triethylsilyl)ethynyl) pentacene, 6,13-bis (t-butyl ethynyl) pentacene, 6,13-bis (Hexyl ethynyl) pentacene, 6,13-triethylsilylethynyl anthradithiophene, poly (3-octylthiophene-2,5-diyl) (P3OT), or combinations thereof.

9. The method of claim 1, wherein the semiconductor material comprises N,N-bis(n-octyl)-1,6-dicyanoperylene-3,4:9,10-bis(dicarboximide) (PDI-8CN2), poly{[N,N'-bis(2-octyldodecyl)-naphthalene 1,4,5,8 bis(dicarboximide)-2,6-diyl] alt-5,5'-(2,2'-bithiophene)}[P(NDI2OD-T2)], or combinations thereof.

10. The method of claim 1, wherein the second droplet forms a well-shaped hydrophobic structure.

11. The method of claim 1, wherein a diameter of the second droplet is relatively less than a diameter of the first droplet.

12. The method of claim 11, wherein the diameter of the second droplet is about 0.3 times to about 0.6 times the diameter of the first droplet.

13. The method of claim 12, wherein the diameter of the second droplet is about0.5 times the diameter of the first droplet.

14. The method of claim 1, further comprising:
dissolving the second droplet in a solvent; and
drying the second droplet to form the hydrophobic structure.

15. The method of claim 14, further comprising adding a hydrophobic agent to the second droplet.

16. The method of claim 15, wherein the hydrophobic agent comprises oxygen ($O_2$), plasma, carbon tetrafluoride ($CF_4$) plasma, cationic di-n-decyl dimethyl ammonium chloride, benzalkonium chloride, or combinations thereof.

17. The method of claim 14, wherein the solvent comprises chlorobenzene, 1,2 dichlorobenzene, or combinations thereof.

18. The method of claim 1, wherein the conductor material comprises (poly (3,4-ethylenedioxythiophene): poly (styrenesulfonate)) (PEDOT:PSS), water soluble doped polyaniline, nano silver dissolved in water, nano gold dissolved in water, or combinations thereof.

19. A method of forming a three-dimensional feature on a substrate, the method comprising:
sequentially dispensing at least three droplets of at least three different deposition materials on a first surface of the substrate to form the three-dimensional feature on the substrate, wherein the at least three droplets are dispensed on substantially same location of the substrate to form overlapping droplets on the substrate; and
adjusting hydrophobic properties of respective surfaces of the overlapping droplets to facilitate self-assembling of the overlapping droplets on the substrate and to control a profile of the three-dimensional feature.

20. The method of claim 19, further comprising controlling a drop volume of each of the at least three droplets to control the profile of the three-dimensional feature.

21. The method of claim 19, wherein sequentially dispensing the at least three droplets comprises sequentially dispensing droplets of a dielectric material, a semiconductor material and a conductor material on the substrate to form an organic thin film transistor.

22. The method of claim 21, wherein a diameter of the droplet of the semiconductor material is relatively less than a diameter of the droplet of the dielectric material to form a hydrophobic feature with a central cavity on a first surface of the droplet of the dielectric material.

23. The method of claim 22, wherein hydrophobic properties of the droplet of the semiconductor material are adjusted such that the conductor material fills the central cavity and forms a conductor material layer around the central cavity to define a source electrode and a drain electrode of the organic thin film transistor.

24. An organic thin film transistor, comprising:
a substrate, with a patterned gate electrode, formed on a first surface of the substrate;
an insulating layer disposed on the first surface of the substrate;
a semiconductor layer, having a well-shaped structure with a central cavity, disposed on a first surface of the insulating layer, wherein a first surface of the well-shaped structure is a hydrophobic surface; and
a water-soluble conductor material, disposed around the semiconductor layer and within the central cavity of the semiconductor layer, to form a source electrode and a drain electrode of the organic thin film transistor.

25. The organic thin film transistor of claim 24, wherein the hydrophobic surface of the semiconductor layer facilitates self-alignment of the water-soluble conductor material to form the source electrode and the drain electrode on the substrate.

* * * * *

UNITED STATES PATENT AND TRADEMARK OFFICE
CERTIFICATE OF CORRECTION

PATENT NO. : 9,680,097 B2  
APPLICATION NO. : 14/782600  
DATED : June 13, 2017  
INVENTOR(S) : Mandal et al.

Page 1 of 1

It is certified that error appears in the above-identified patent and that said Letters Patent is hereby corrected as shown below:

In Column 1, Line 8, delete "application is U.S." and insert -- application is a U.S. --, therefor.

In Column 1, Lines 8-9, delete "35 U.S.C. 371" and insert -- 35 U.S.C. § 371 --, therefor.

In Column 4, Line 50, delete "12 mm Specific" and insert -- 12 mm. Specific --, therefor.

In Column 4, Line 55, delete "6 mm Specific" and insert -- 6 mm. Specific --, therefor.

In Column 5, Line 22, delete "8 mm Specific" and insert -- 8 mm. Specific --, therefor.

In Column 6, Line 26, delete "1 microlitre GAL)" and insert -- 1 microlitre (µL) --, therefor.

In Column 6, Line 33, delete "1.5 microlitres GAL)" and insert -- 1.5 microlitres (µL) --, therefor.

In Column 6, Line 34, delete "5.5 mm Here," and insert -- 5.5 mm. Here, --, therefor.

In Column 11, Line 49, in Claim 13, delete "about0.5 times" and insert -- about 0.5 times --, therefor.

Signed and Sealed this
Twenty-ninth Day of August, 2017

Joseph Matal
*Performing the Functions and Duties of the*
*Under Secretary of Commerce for Intellectual Property and*
*Director of the United States Patent and Trademark Office*